United States Patent
Saitoh et al.

(10) Patent No.: US 11,342,398 B2
(45) Date of Patent: May 24, 2022

(54) DISPLAY DEVICE AND METHOD OF MANUFACTURING SAME

(71) Applicant: SHARP KABUSHIKI KAISHA, Osaka (JP)

(72) Inventors: Takao Saitoh, Sakai (JP); Masaki Yamanaka, Sakai (JP); Seiji Kaneko, Sakai (JP); Yohsuke Kanzaki, Sakai (JP); Masahiko Miwa, Sakai (JP); YI Sun, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 135 days.

(21) Appl. No.: 16/969,411

(22) PCT Filed: Feb. 21, 2018

(86) PCT No.: PCT/JP2018/006279
§ 371 (c)(1),
(2) Date: Aug. 12, 2020

(87) PCT Pub. No.: WO2019/163030
PCT Pub. Date: Aug. 29, 2019

(65) Prior Publication Data
US 2021/0057500 A1    Feb. 25, 2021

(51) Int. Cl.
*H01L 27/32* (2006.01)
*H01L 51/56* (2006.01)
*H01L 51/00* (2006.01)

(52) U.S. Cl.
CPC ...... *H01L 27/3258* (2013.01); *H01L 27/3276* (2013.01); *H01L 51/56* (2013.01); *H01L 51/0097* (2013.01); *H01L 2227/323* (2013.01); *H01L 2251/5338* (2013.01)

(58) Field of Classification Search
CPC .................. H01L 27/3258; H01L 27/3276
See application file for complete search history.

(56) References Cited

U.S. PATENT DOCUMENTS

| | | | |
|---|---|---|---|
| 10,971,566 B2* | 4/2021 | Saitoh | ........................ G09F 9/30 |
| 2014/0353670 A1 | 12/2014 | Youn et al. | |
| 2015/0287750 A1 | 10/2015 | Youn et al. | |
| 2017/0170206 A1* | 6/2017 | Lee | .................. H01L 29/78633 |
| 2019/0355800 A1* | 11/2019 | Saitoh | ................. H01L 27/3246 |

FOREIGN PATENT DOCUMENTS

JP        2014-232300 A        12/2014

* cited by examiner

*Primary Examiner* — Douglas M Menz
(74) *Attorney, Agent, or Firm* — ScienBiziP, P.C.

(57) ABSTRACT

There are provided wires in a frame area. The wires run parallel to each other in a direction crossing a direction in which a bending portion is extended. An inorganic insulating film has an opening therethrough in the bending portion. A top face of a resin substrate is exposed in the opening. The wires are provided on the inorganic insulating film and on the top face of the resin substrate exposed in the opening. In the opening, the top face of the resin substrate and an end face of the inorganic insulating film make a smaller angle below between the wires than below the wires.

11 Claims, 7 Drawing Sheets

DISPLAY DEVICE AND METHOD OF MANUFACTURING SAME

TECHNICAL FIELD

The disclosure relates to display devices and methods of manufacturing the display devices.

BACKGROUND ART

The OLED display device, or the self-luminous display device built around OLEDs (organic light-emitting diodes), has been attracting attention as an alternative to the liquid crystal display device. Some proposed OLED display devices are flexible, with OLEDs and other elements being formed on a flexible resin substrate. An OLED display device includes a rectangular display area for displaying an image and a frame area surrounding the display area. There is a demand to reduce the frame area. If the frame area is reduced in a flexible OLED display device, for example, by bending the frame area on a terminal end thereof, wiring could break up in the frame area.

For instance, Patent Literature 1 discloses a flexible display device in which those parts of a buffer film, a gate insulating film, and an interlayer insulating film that are in the bending area are removed by providing bending holes, in order to prevent wiring from breaking up.

CITATION LIST

Patent Literature

Patent Literature 1: Japanese Unexamined Patent Application Publication, Tokukai, No. 2014-232300

SUMMARY

Technical Problem

Some flexible OLED display devices include inorganic insulating films such as a base coat film, a gate insulating film, and an interlayer insulating film on a resin substrate. To prevent wiring form breaking up in the frame area in such a flexible OLED display device, the inorganic insulating film is often removed in the bending portion of the frame area so that the inorganic insulating film is not torn up in the bending portion. When a metal film is formed so as to cover those parts from which the inorganic insulating film has been removed, and the metal film is patterned by photolithography to form parallel wires, a resist pattern may fail to be formed in a desired pattern on the metal film and leave metal film residues remaining between the wires, which could cause short-circuiting between the wires.

In view of the foregoing problems, it is an object of the disclosure to restrain short-circuiting between wires in a bending portion of the frame area.

Solution to Problem

To achieve the object, the disclosure is directed to a display device including: a resin substrate; a TFT layer on the resin substrate; light-emitting elements on the TFT layer, the light-emitting elements forming a display area; a frame area surrounding the display area; a terminal region along a side of the frame area; a bending portion between the display area and the terminal region, the bending portion being extended in one direction; at least one inorganic insulating film on the resin substrate, the at least one inorganic insulating film forming the TFT layer; and a plurality of wires in the frame area, the plurality of wires forming the TFT layer and running parallel to each other in a direction crossing the direction in which the bending portion is extended, wherein the at least one inorganic insulating film has an opening therethrough in the bending portion, a top face of the resin substrate being exposed in the opening, the plurality of wires is provided on the at least one inorganic insulating film and on the top face of the resin substrate exposed in the opening, and in the opening, the top face of the resin substrate and an end face of the at least one inorganic insulating film make a smaller angle below between the plurality of wires than below the plurality of wires.

Advantageous Effects of Disclosure

The disclosure renders the angle between the top face of the resin substrate and the end face of the at least one inorganic insulating film in the opening smaller below between the plurality of wires than below the plurality of wires, thereby restraining short-circuiting between the wires in the bending portion of the frame area.

DESCRIPTION OF EMBODIMENTS

The following will describe embodiments of the disclosure in detail with reference to drawings. The disclosure is not limited to the following embodiments.

First Embodiment

Figure 1:
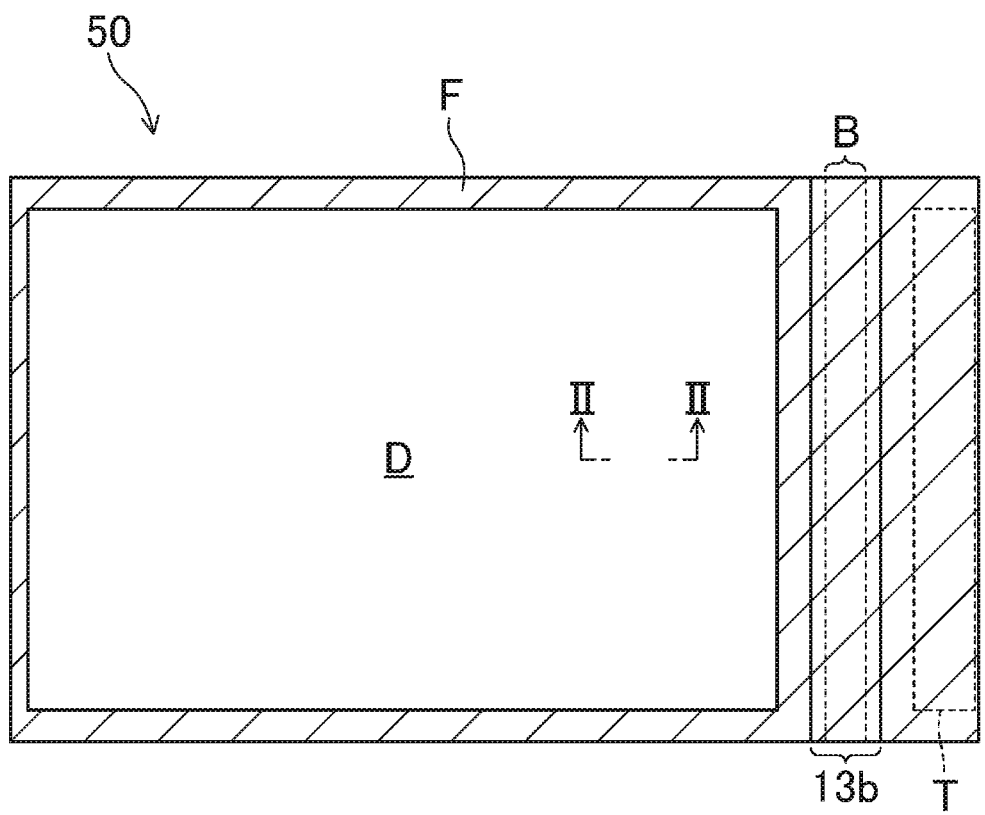
FIG. 1 is a schematic plan view of a structure of an OLED display device in accordance with a first embodiment of the disclosure.
Figure 2:
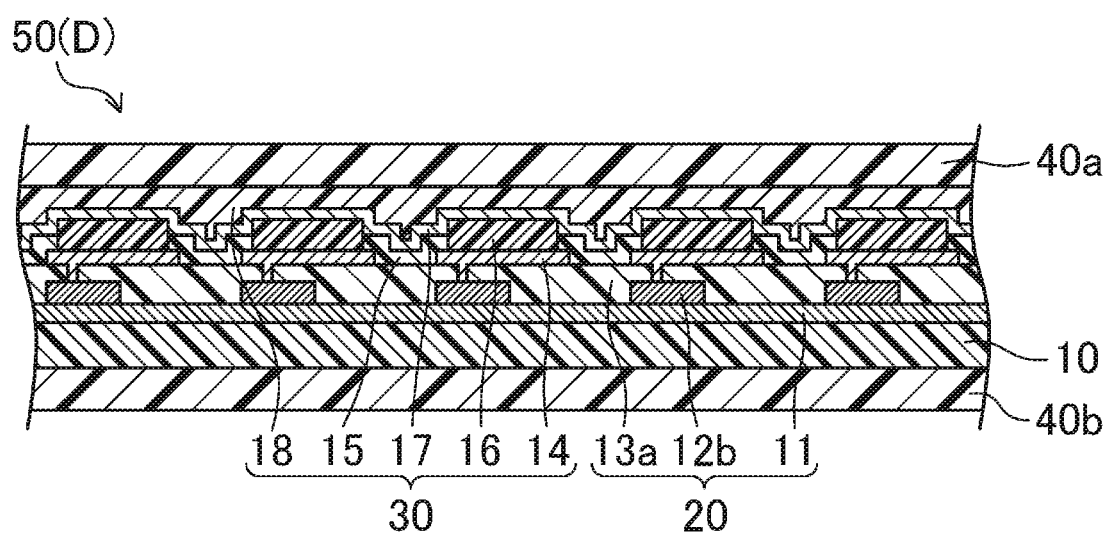
FIG. 2 is a schematic cross-sectional view of the structure of the OLED display device, taken along line II-II shown in FIG. 1.
Figure 3:
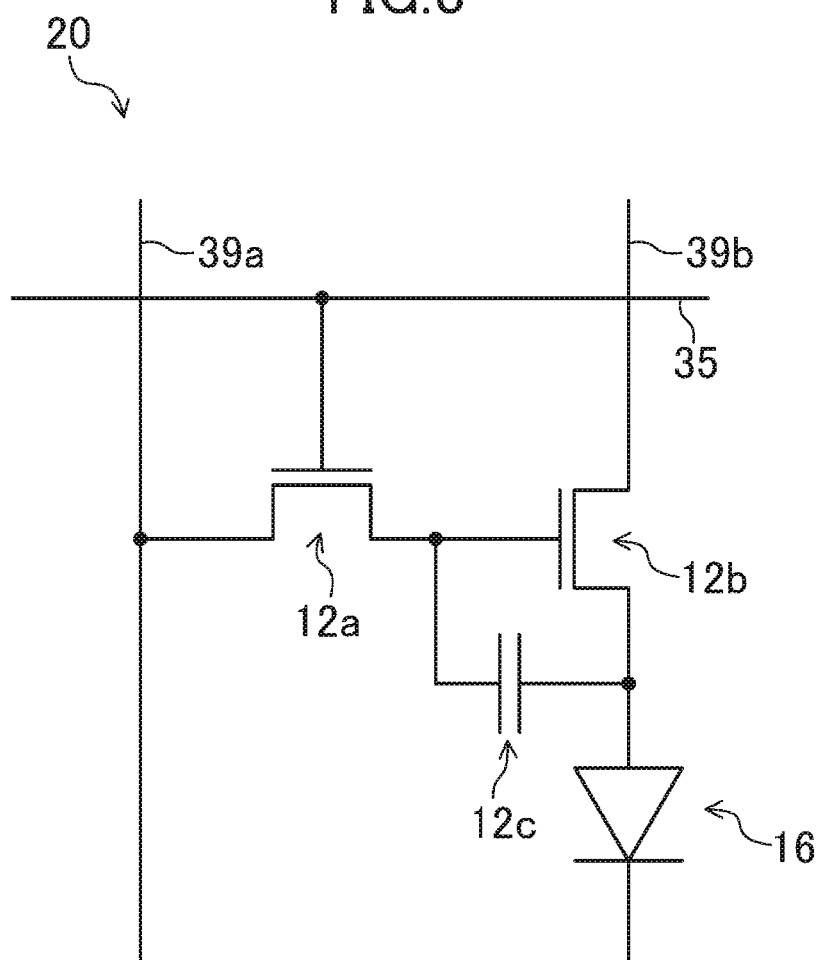
FIG. 3 is an equivalent circuit diagram of a TFT layer in the OLED display device in accordance with the first embodiment of the disclosure.
Figure 4:
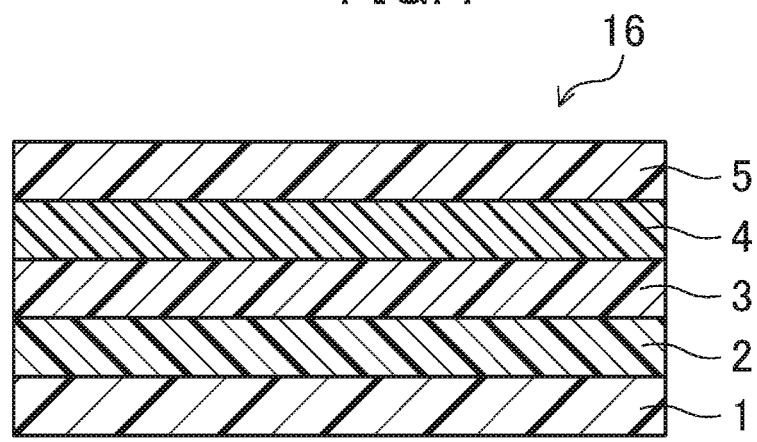
FIG. 4 is a cross-sectional view of an organic light-emitting layer in the OLED display device in accordance with the first embodiment of the disclosure.
Figure 5:
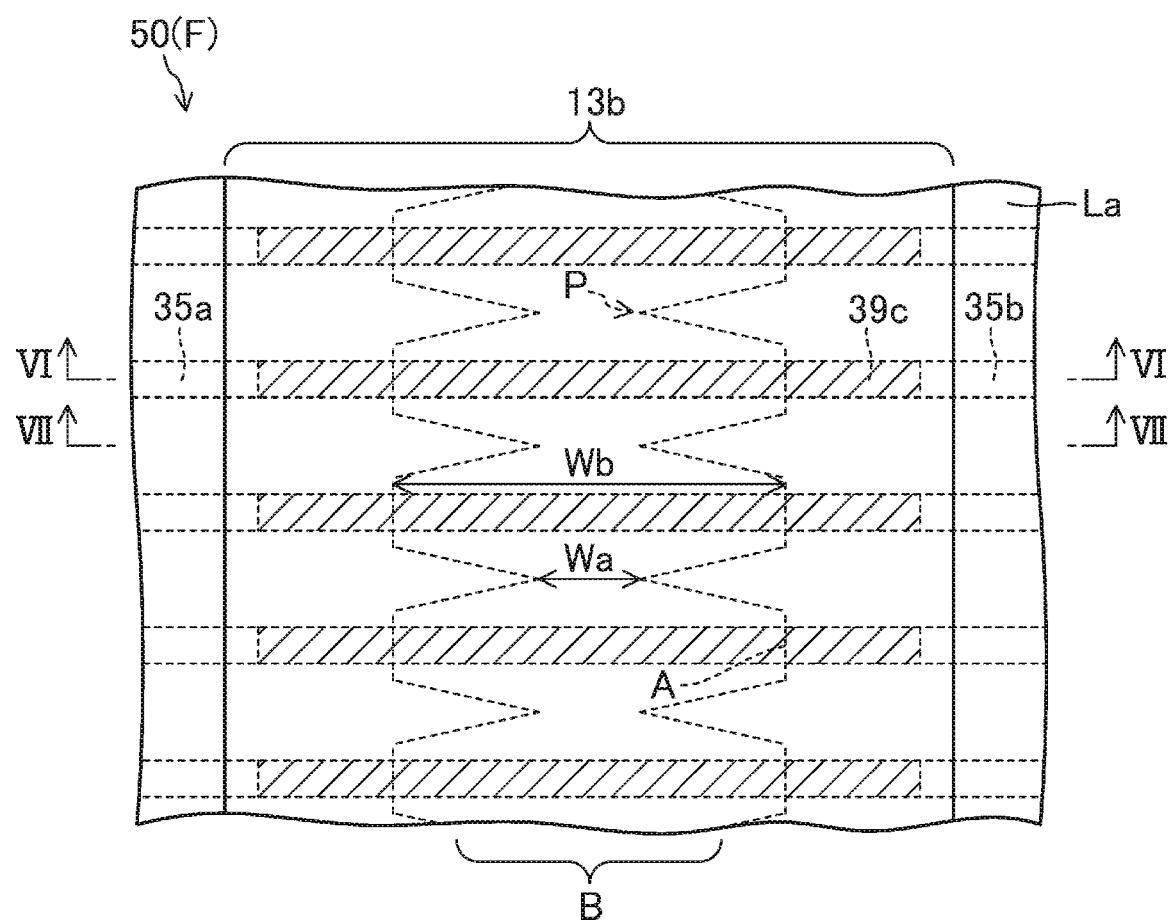
FIG. 5 is a plan view of a bending portion of a frame area of the OLED display device in accordance with the first embodiment of the disclosure.
Figure 6:
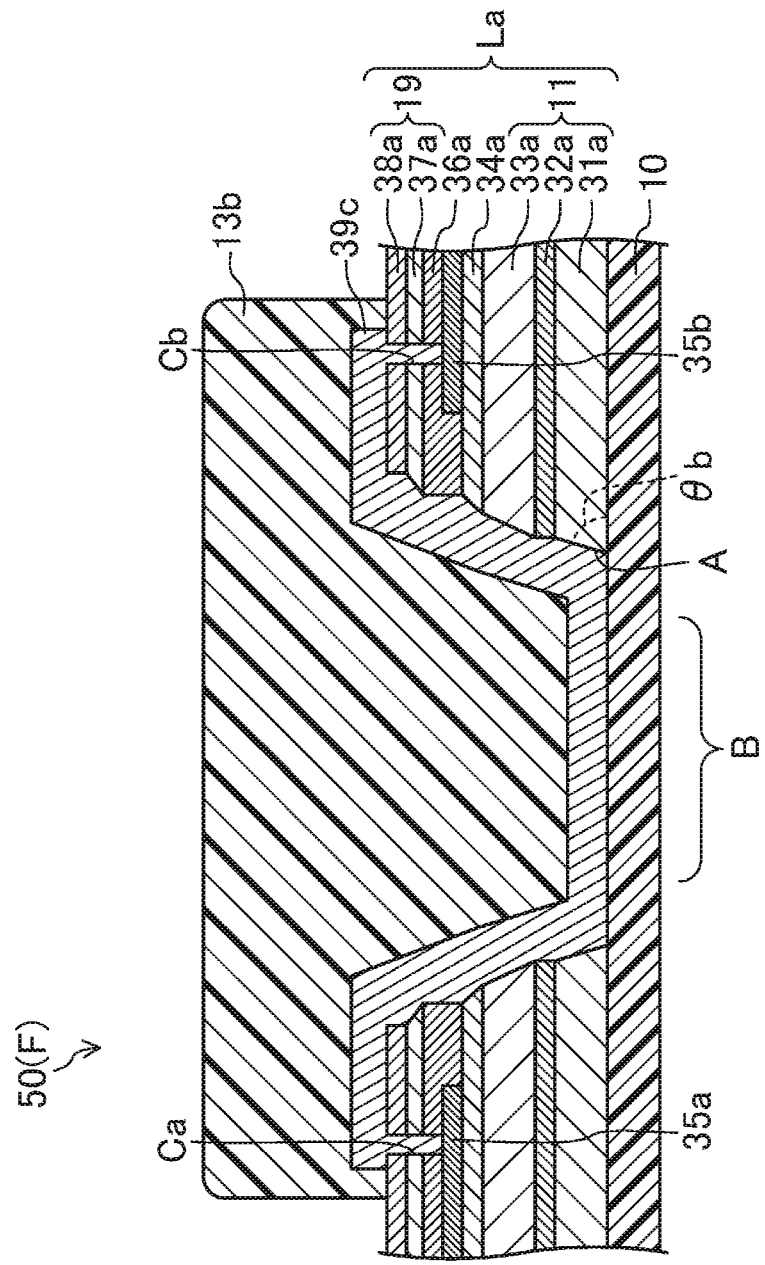
FIG. 6 is a cross-sectional view of the frame area of the OLED display device, taken along line VI-VI shown in FIG. 5.
Figure 7:
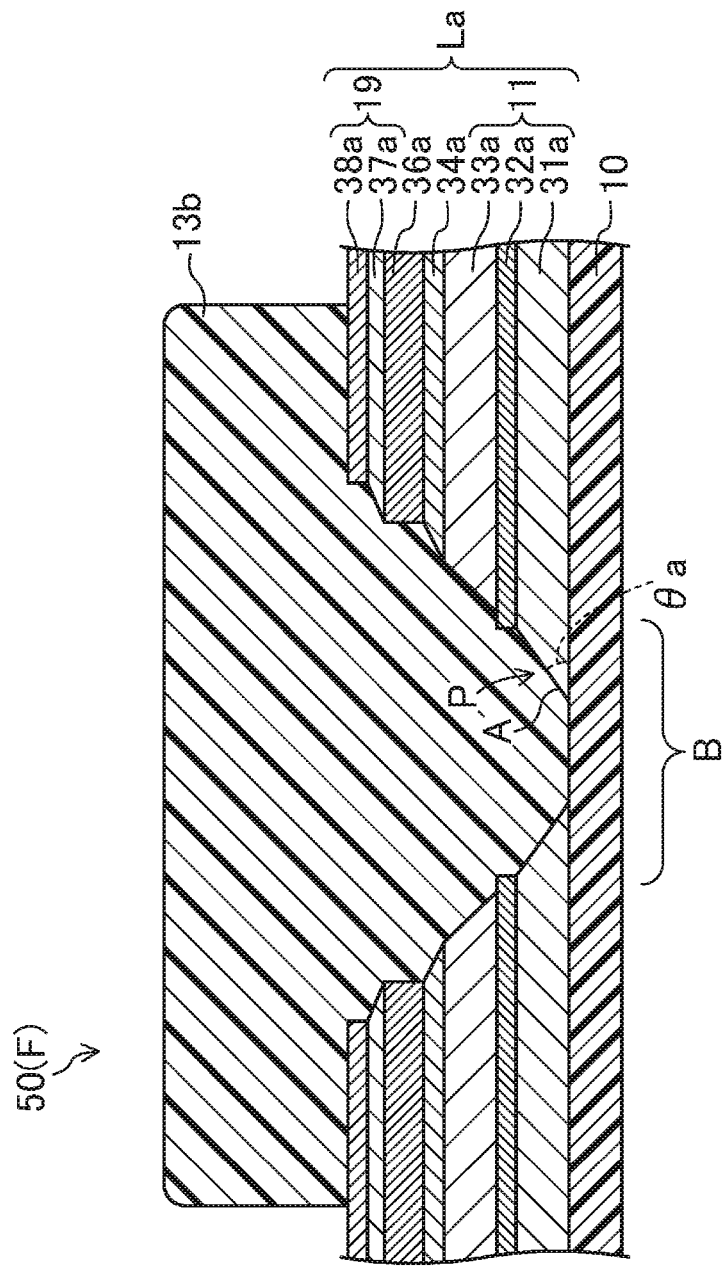
FIG. 7 is a cross-sectional view of the frame area of the OLED display device, taken along line VII-VII shown in FIG. 5.

FIGS. 1 to 12 depict a first embodiment of a display device and a method of manufacturing the display device in accordance with the disclosure. The following embodiments will discuss OLED display devices including OLEDs as an example of the display device including light-emitting elements. FIG. 1 is a schematic plan view of a structure of an OLED display device 50 in accordance with the present embodiment. FIG. 2 is a schematic cross-sectional view of a structure of a display area D of the OLED display device 50, taken along line II-II shown in FIG. 1. FIG. 3 is an equivalent circuit diagram of a TFT layer 20 in the OLED display device 50. FIG. 4 is a cross-sectional view of an organic light-emitting layer 16 in the OLED display device 50. FIG. 5 is a plan view of a bending portion B of a frame area F of the OLED display device 50. FIGS. 6 and 7 are cross-sectional views of the frame area F of the OLED display device 50, taken along lines VI-VI and VII-VII shown in FIG. 5 respectively.

Referring to FIG. 1, the OLED display device 50 includes the rectangular display area D for displaying an image and the frame area F (indicated by hatching in the figure) surrounding the display area D. The display area D includes a matrix of pixels in each of which there are provided, for example, a subpixel for producing a grayscale display in red, a subpixel for producing a grayscale display in green, and a subpixel for producing a grayscale display in blue adjacent to each other. As shown in FIG. 1, the frame area F has a terminal region T on the far right of the figure. The frame area F also has the bending portion B between the display area D and the terminal region T along a side of the display area D (the right-hand side of the figure) as shown in FIG. 1. The bending portion B can be bent 180° around a line that is parallel to the vertical direction in the figure (to form a U-shape).

The OLED display device 50, as shown in FIG. 2, includes, in the display area D: a resin substrate layer 10 as a resin substrate; the TFT layer 20 on the resin substrate layer 10; OLEDs 30 (light-emitting elements of the display area D) on the TFT layer 20; a front-side protection layer 40a on the OLEDs 30; and a backside protection layer 40b on the bottom face of the resin substrate layer 10.

The resin substrate layer 10 is made of, for example, polyimide resin having a thickness of approximately 10 μm to 20 μm.

Referring to FIG. 2, the TFT layer 20 includes: a base coat film 11 on the resin substrate layer 10; a plurality of first TFTs 12a (see FIG. 3) and a plurality of second TFTs 12b on the base coat film 11; and a planarization film 13a on each first TFT 12a and on each second TFT 12b. The TFT layer 20 includes therein a plurality of gate lines 35 extending parallel to each other in the lateral direction in the figure as shown in FIG. 3 and a plurality of source lines 39a extending parallel to each other in the vertical direction in the figure as shown in FIG. 3. The TFT layer 20 further includes a plurality of power supply lines 39b adjacent to the respective source lines 39a and extending parallel to each other in the vertical direction in the figure as shown in FIG. 3. The TFT layer 20 further includes the first TFTs 12a, the second TFTs 12b, and capacitors 12c, one each in every subpixel, as shown in FIG. 3.

The base coat film 11 includes a first base coat film 31a on the resin substrate layer 10, a second base coat film 32a on the first base coat film 31a, and a third base coat film 33a on the second base coat film 32a, as shown in FIGS. 6 and 7. The first base coat film 31a includes, for example, an inorganic insulating film such as a silicon oxynitride film having a thickness of approximately 500 nm. The second base coat film 32a includes, for example, an inorganic insulating film such as a silicon nitride film having a thickness of approximately 50 nm to 100 nm. The third base coat film 33a includes, for example, an inorganic insulating film such as a silicon oxide film having a thickness of approximately 300 nm.

Each first TFT 12a is connected to an associated one of the gate lines 35 and an associated one of the source lines 39a in the subpixel as shown in FIG. 3. Each second TFT 12b is connected to an associated one of the first TFTs 12a and an associated one of the power supply lines 39b in the subpixel as shown in FIG. 3. The first TFT 12a and the second TFT 12b each include, for example: a semiconductor layer provided in an insular manner on the base coat film 11; a gate insulating film 34a (see FIGS. 6 and 7) provided so as to cover the semiconductor layer; a gate electrode provided on the gate insulating film 34a so as to overlap a part of the semiconductor layer; a first interlayer insulating film 36a (see FIGS. 6 and 7) and a second interlayer insulating film 19 (see FIGS. 6 and 7) that are provided sequentially so as to cover the gate electrode; and a source electrode and a drain electrode provided on the second interlayer insulating film 19 so as to be separated from each other. The gate insulating film 34a includes, for example, an inorganic insulating film such as a silicon oxide film having a thickness of approximately 100 nm. The first interlayer insulating film 36a includes, for example, an inorganic insulating film such as a silicon nitride film having a thickness of approximately 100 nm. The second interlayer insulating film 19 includes, for example, an underlying film 37a made of an inorganic insulating film such as a silicon oxide film having a thickness of approximately 200 nm to 300 nm and an overlying film 38a made of an inorganic insulating film such as a silicon nitride film having a thickness of approximately 150 nm to 200 nm. The first TFTs 12a and the second TFTs 12b are top-gate TFTs in the present embodiment, but may alternatively be bottom-gate TFTs.

Each capacitor 12c is connected to an associated one of the first TFTs 12a and an associated one of the power supply lines 39b in the subpixel as shown in FIG. 3. The capacitor 12c includes, for example, a pair of electrodes and the first interlayer insulating film 36a (see FIGS. 6 and 7) between the pair of electrodes. The pair of electrodes includes an electrode formed of the same material and in the same layer as the gate electrode and an electrode provided opposite this electrode.

The planarization film 13a is made of, for example, a colorless, transparent organic resin material such as polyimide resin.

The OLEDs 30 include a plurality of first electrodes 14, an edge cover 15, a plurality of organic light-emitting layers 16, a second electrode 17, and a sealing film 18 that are provided sequentially on the planarization film 13a as shown in FIG. 2.

The first electrodes 14, one for each subpixel, are provided in a matrix on the planarization film 13a as shown in FIG. 2. Each first electrode 14 is connected to the drain electrode of the second TFT 12b through a contact hole in the planarization film 13a as shown in FIG. 2. The first electrode 14 has a function of injecting holes to the organic light-emitting layer 16. The first electrode 14 is preferably formed of a material that has a large work function in order to improve the efficiency of hole injection to the organic light-emitting layer 16. The first electrode 14 is made of, for example, a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). Alternatively, the first electrode 14 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the first electrode 14 may be made of, for example, an electrically conductive oxide such as tin oxide (SnO), zinc oxide (ZnO), indium tin oxide (ITO), or indium zinc oxide (IZO). As a further alternative, the first electrode 14 may be a stack of layers of any of these materials. Examples of materials that have a large work function include indium tin oxide (ITO) and indium zinc oxide (IZO).

The edge cover 15 is arranged to form a lattice covering the peripheral portions of the first electrodes 14 as shown in FIG. 2. The edge cover 15 is made of, for example, either an inorganic film such as a film of silicon oxide (SiO$_2$), silicon nitride (SiNx, where x is a whole number) (e.g., trisilicon tetranitride (Si$_3$N$_4$)), or silicon oxynitride (SiNO) or an organic film such as a film of polyimide resin, acrylic resin, polysiloxane resin, or novolac resin.

The organic light-emitting layers 16, one for each sub-pixel, are arranged in a matrix on the first electrodes 14 as shown in FIG. 2. Each organic light-emitting layer 16 includes a hole injection layer 1, a hole transport layer 2, a light-emitting layer 3, an electron transport layer 4, and an electron injection layer 5 that are provided sequentially on the first electrode 14 as shown in FIG. 4.

The hole injection layer 1 is alternatively referred to as the anode buffer layer and has a function of bringing the energy levels of the first electrode 14 and the organic light-emitting layer 16 closer to each other to improve the efficiency of hole injection from the first electrode 14 to the organic light-emitting layer 16. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transportation from the first electrode 14 to the organic light-emitting layer 16. The hole transport layer 2 is made of, for example, a porphyrin derivative, an aromatic tertiary amine compound, a styryl amine derivative, polyvinylcarbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 14 and the second electrode 17 respectively when the light-emitting layer 3 is under the voltage applied by the first electrode 14 and the second electrode 17. The injected holes and electrons recombine in the light-emitting layer 3. The light-emitting layer 3 is made of a material that has a high light-emitting efficiency. The light-emitting layer 3 is made of, for example, a metal oxynoid compound [8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxynoid compound.

The electron injection layer 5 has a function of bringing the energy levels of the second electrode 17 and the organic light-emitting layer 16 closer to each other to improve the efficiency of electron injection from the second electrode 17 to the organic light-emitting layer 16. This function can lower the drive voltage of the OLED 30. The electron injection layer 5 is alternatively referred to as the cathode buffer layer. The electron injection layer 5 is made of, for example, an inorganic alkali compound such as lithium fluoride (LiF), magnesium fluoride (MgF$_2$), calcium fluoride (CaF$_2$), strontium fluoride (SrF$_2$), or barium fluoride (BaF$_2$); aluminum oxide (Al$_2$O$_3$); or strontium oxide (SrO).

The second electrode 17 is provided so as to cover the organic light-emitting layer 16 and the edge cover 15 as shown in FIG. 2. The second electrode 17 has a function of injecting electrons to the organic light-emitting layer 16. The second electrode 17 is preferably formed of a material that has a small work function in order to improve the efficiency of electron injection to the organic light-emitting layer 16. The second electrodes 17 are made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). Alternatively, the second electrodes 17 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrodes 17 may be made of, for example, an electrically conductive oxide such as tin oxide (SnO), zinc oxide (ZnO), indium tin oxide (ITO), or indium zinc oxide (IZO). As a further alternative, the second electrodes 17 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), or lithium fluoride-calcium-aluminum (LiF—Ca—Al).

The sealing film 18 is provided so as to cover the second electrodes 17 as shown in FIG. 2 and has a function of protecting the organic light-emitting layers 16 from, for example, water and oxygen. The sealing film 18 is made of, for example, either an inorganic material such as silicon oxide ($SiO_2$), aluminum oxide ($Al_2O_3$), silicon nitride (SiNx, where x is a positive number) (e.g., trisilicon tetranitride ($Si_3N_4$)), or silicon carbide nitride (SiCN) or an organic material such as acrylate, polyurea, parylene, polyimide, or polyamide.

The front-side protection layer 40a and the backside protection layer 40b are made of, for example, polyimide resin having a thickness of approximately 2 µm.

Referring to FIGS. 5 to 7, the OLED display device 50 includes, in the frame area F, the resin substrate layer 10, an inorganic insulating laminate film La, a plurality of frame wires 39c, and a planarization film 13b. The inorganic insulating laminate film La is provided on the resin substrate layer 10. The frame wires 39c are provided on the inorganic insulating laminate film La so as to extend parallel to each other in a direction perpendicular to the direction in which the bending portion B is extended. The planarization film 13b is provided so as to cover the frame wires 39c. The front-side protection layer 40a and the backside protection layer 40b, provided in the display area D, are also provided in most parts of the frame area F, but not provided in the bending portion B of the frame area F.

The inorganic insulating laminate film La, as shown in FIGS. 6 and 7, is provided on the resin substrate layer 10. The inorganic insulating laminate film La provides at least one inorganic insulating film in the TFT layer 20 and includes the base coat film 11, the gate insulating film 34a, the first interlayer insulating film 36a, and the second interlayer insulating film 19 sequentially stacked on the resin substrate layer 10. In the bending portion B of the frame area F, the inorganic insulating laminate film La has openings A formed through the inorganic insulating laminate film La to expose the top face of the resin substrate layer 10 as shown in FIGS. 5 to 7.

As shown in FIGS. 5 to 7, each opening A is shaped like a groove running all the way through in a direction in which the bending portion B is extended. In the opening A, the top face of the resin substrate layer 10 and an end face of the inorganic insulating laminate film La make a smaller angle below between the frame wires 39c (see θa in FIG. 7) than below the frame wires 39c (see θb in FIG. 6). The width(s) of the opening A is measured in a direction (lateral direction in the figure) that crosses the direction (vertical direction in the figure) in which the bending portion B is extended. The opening A has a width Wa below between the frame wires 39c (e.g., approximately 0.5 mm) and a width Wb below the frame wires 39c (e.g., approximately 2 mm) as shown in FIG. 5, where Wa is smaller than Wb. In the opening A, the inorganic insulating laminate film La has, below between the frame wires 39c, projection portions P formed so as to taper toward the widthwise center of the opening A as shown in FIGS. 5 and 7. The angle θa between the top face of the resin substrate layer 10 and the end face of the projection portion P is from 10° to 50°, both inclusive, for example, for the reasons detailed later. The projection portions P are provided on both the left and right sides of the openings A in the present embodiment. Alternatively, the projection portions P may be provided only on one of the left and right sides of each opening A.

The frame wires 39c are provided on the inorganic insulating laminate film La and on the top face of the resin substrate layer 10 exposed in the openings A as shown in FIGS. 5 and 6. Each frame wire 39c has both ends thereof connected respectively to a first gate conductive layer 35a and a second gate conductive layer 35b via a first contact hole Ca and a second contact hole Cb formed through a stack of the first interlayer insulating film 36a and the second interlayer insulating film 19 below the planarization film 13b as shown in FIG. 6. The frame wire 39c is made of, for example, a conductive metal laminate film 39 (see FIG. 12) that includes, for example, a stack of a titanium film (approximately 30-nm to 200-nm thick), an aluminum film (approximately 100-nm to 1000-nm thick), and a titanium film (approximately 30-nm to 200-nm thick). Each frame wire 39c has a width of, for example, approximately 3 µm and is separated from the adjacent frame wires 39c by a distance of, for example, approximately 6 µm.

The first gate conductive layer 35a is provided between the gate insulating film 34a and the first interlayer insulating film 36a and electrically connected to signal wires in the TFT layer 20 in the display area D (a gate line 26, a source line 27a, and a power supply line 27b) as shown in FIG. 6. The second gate conductive layer 35b is provided between the gate insulating film 34a and the first interlayer insulating film 36a and extended to the terminal region T as shown in FIG. 6.

The planarization film 13b is formed of the same material and in the same layer as the planarization film 13a. The planarization film 13b is shaped like a strip so as to cover the openings A in the inorganic insulating laminate film La and the edges of the inorganic insulating laminate film La where the openings A are formed, as shown in FIGS. 1, 5, and 6. The planarization film 13b is formed of the same material and in the same layer as the planarization film 13a as an example in the present embodiment. Alternatively, the planarization film 13b may be formed of the same material and in the same layer as, for example, the edge cover 15.

The OLED display device 50 described above is arranged in each subpixel P to turn on the first TFT 12a by inputting a gate signal to the first TFT 12a via the gate line 35 and apply a prescribed voltage corresponding to a source signal to the gate electrode of the second TFT 12b and the capacitor 12c via the source line 39a in order to specify the magnitude of the current from the power supply line 39b on the basis of the gate voltage of the second TFT 12b, so that the specified current is fed to the organic light-emitting layer 16, thereby causing the light-emitting layer 3 in the organic light-emitting layer 16 to emit light to display an image. In the OLED display device 50, the gate voltage of the second TFT 12b is retained by the capacitor 12c even if the first TFT 12a is turned off. The light-emitting layer 3 therefore continuously emits light until a gate signal is inputted in the next frame.

Figure 8:
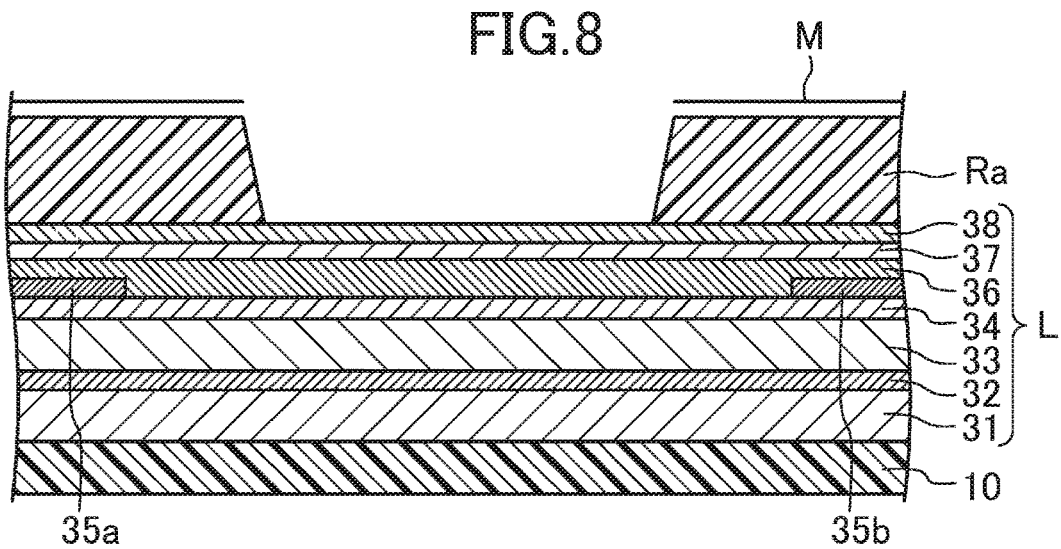
FIG. 8 is a cross-sectional view, associated with FIG. 6, that illustrates an etching step in which a first resist pattern is formed, in a method of manufacturing an OLED display device in accordance with the first embodiment of the disclosure.
Figure 9:
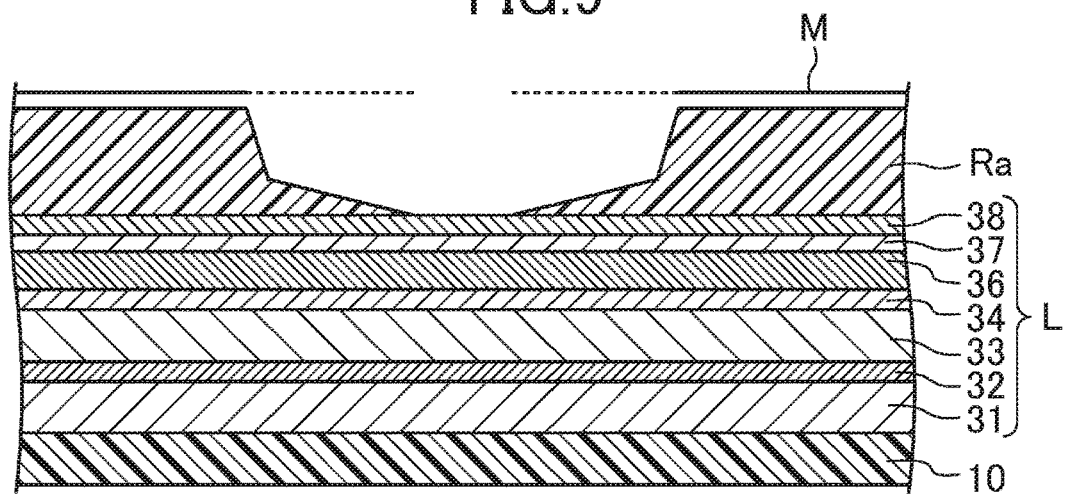
FIG. 9 is a cross-sectional view, associated with FIG. 7, that illustrates the etching step in which the first resist pattern is formed, in the method of manufacturing an OLED display device in accordance with the first embodiment of the disclosure.
Figure 10:
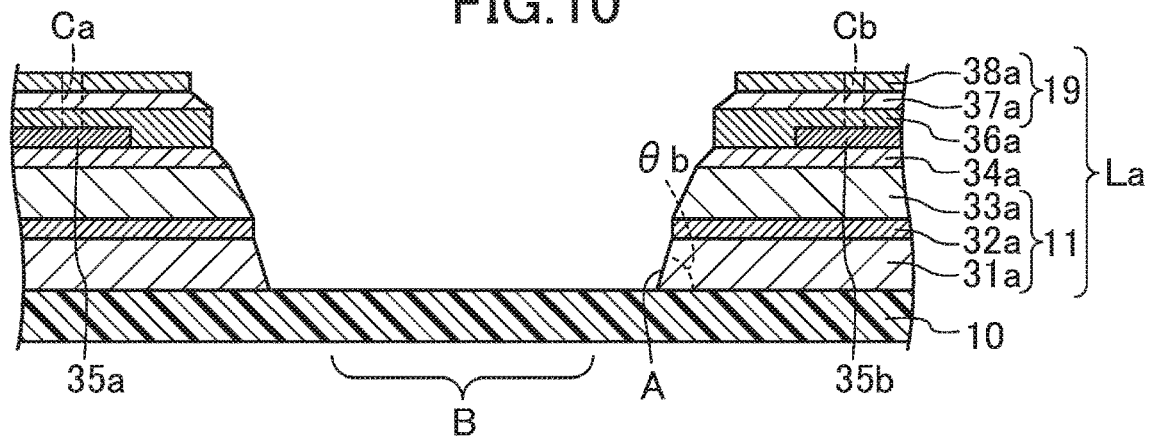
FIG. 10 is a cross-sectional view, associated with FIG. 6, that illustrates the condition after the etching step of the method of manufacturing an OLED display device in accordance with the first embodiment of the disclosure.
Figure 11:
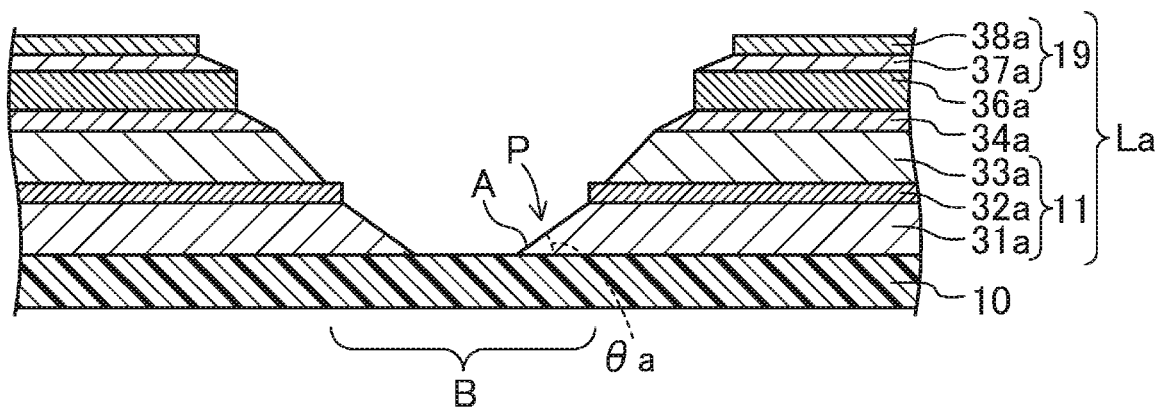
FIG. 11 is a cross-sectional view, associated with FIG. 7, that illustrates the condition after the etching step of the method of manufacturing an OLED display device in accordance with the first embodiment of the disclosure.
Figure 12:
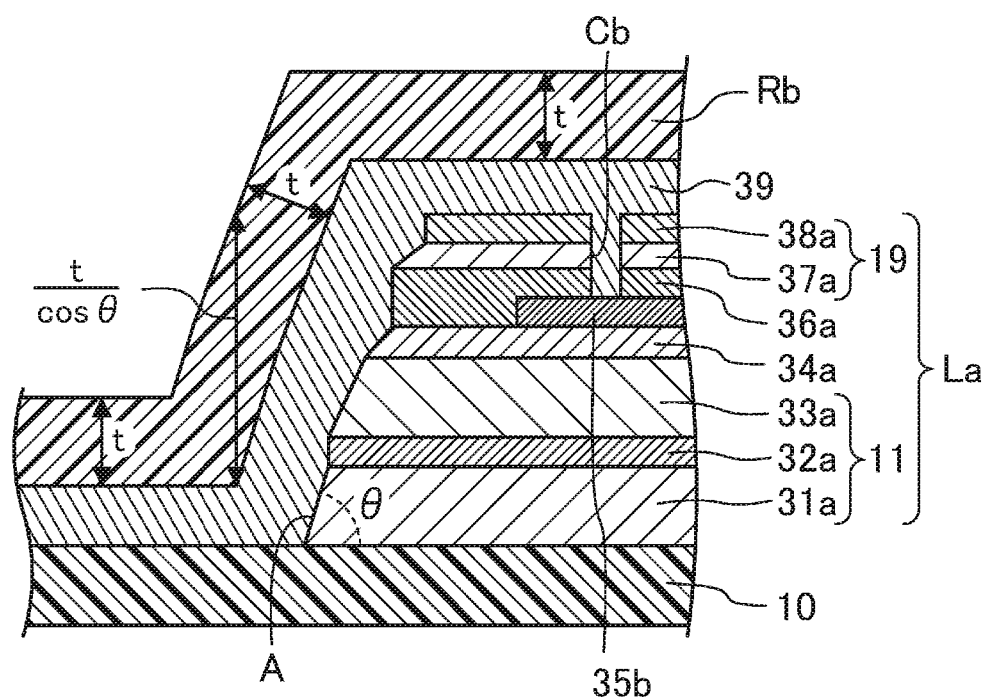
FIG. 12 is a cross-sectional view, associated with FIG. 6, that illustrates a wire forming step of the method of manufacturing an OLED display device in accordance with the first embodiment of the disclosure.

Next will be described a method of manufacturing the OLED display device 50 in accordance with the present embodiment with reference to FIGS. 8 to 12. FIGS. 8 and 9 are cross-sectional views, associated with FIGS. 6 and 7 respectively, that illustrate a first resist pattern Ra formed in an etching step of the method of manufacturing the OLED display device 50. FIGS. 10 and 11 are cross-sectional views, associated with FIGS. 6 and 7 respectively, that illustrate the condition after the etching step of the method of manufacturing the OLED display device 50. FIG. 12 is a cross-sectional view, associated with FIG. 6, that illustrates a wire forming step of the method of manufacturing the OLED display device 50. The method of manufacturing the OLED display device 50 in accordance with the present embodiment includes: a TFT layer forming step including an etching step and a wire forming step; an OLED forming step; and a flexibilization step.

TFT Layer Forming Step

The TFT layer 20 is formed, for example, by forming the base coat film 11, the first TFTs 12*a*, the second TFTs 12*b*, the capacitors 12*c*, and the planarization films 13*a* and 13*b* on the resin substrate layer 10 on a glass substrate by a well-known method.

The following will specifically describe a method of forming the openings A in the inorganic insulating laminate film La in the bending portion B of the frame area F in the formation of the first TFTs 12*a*, the second TFTs 12*b*, and the capacitors 12*c* in the display area D.

Before the source lines 39*a* and the power supply lines 39*b* are formed, the inorganic insulating laminate film L includes a stack of a first inorganic insulating film 31, a second inorganic insulating film 32, a third inorganic insulating film 33, a fourth inorganic insulating film 34, a fifth inorganic insulating film 36, a sixth inorganic insulating film 37, and a seventh inorganic insulating film 38 that are provided sequentially on the resin substrate layer 10 as shown in FIGS. 8 and 9.

The first resist pattern Ra is first formed on the inorganic insulating laminate film L using a halftone mask M as shown in FIGS. 8 and 9. The halftone mask M is formed to shield those regions where no openings A are to be formed (see parts of the halftone mask M that are indicated by solid lines) and fully or half expose to light those regions where the openings A are to be formed (see openings in the halftone mask M and parts of the halftone mask M that are indicated by broken lines) as shown in FIGS. 8 and 9. The regions half exposed to light are regions which will be the edge portions of the openings A between the frame wires 39*c* formed in a later step and in which the projection portions P (see FIG. 5) of the inorganic insulating laminate film La are to be formed, as shown in FIG. 9. The first resist pattern Ra is formed using the halftone mask M as an example in the present embodiment. Alternatively, the first resist pattern Ra may be formed using a gray tone mask.

Subsequently, those parts of the inorganic insulating laminate film L that are exposed under the first resist pattern Ra are removed by dry etching, to form the openings A in the inorganic insulating laminate film L to form the inorganic insulating laminate film La with the openings A as shown in FIGS. 10 and 11 (etching step). This step renders the angle Oa between the top face of the resin substrate layer 10 and the end face of the inorganic insulating laminate film La not below any frame wires 39*c* formed in a later step (see FIG. 11) smaller than the angle Ob between the top face of the resin substrate layer 10 and the end face of the inorganic insulating laminate film La below the frame wires 39*c*. Thereafter, the first contact hole Ca and the second contact hole Cb (see dash-double-dot lines in FIG. 10) are formed in the first interlayer insulating film 36*a* and the second interlayer insulating film 19 in the inorganic insulating laminate film La.

The conductive metal laminate film 39 described above is formed by sputtering so as to cover the inorganic insulating laminate film La in which the first contact hole Ca and the second contact hole Cb are formed as shown in FIG. 12. A second resist pattern Rb is then formed on the conductive metal laminate film 39, and the conductive metal laminate film 39 is removed from the second resist pattern Rb, to form the frame wires 39*c* (wire forming step). The source lines 39*a* and the power supply lines 39*b*, as well as the source and drain electrodes of the first TFTs 12*a* (second TFTs 12*b*), are formed simultaneously with the frame wires 39*c*. The second resist pattern Rb is formed thinner than the thickness of the inorganic insulating laminate film La (sum thickness of the inorganic insulating films) as shown in FIG. 12. The second resist pattern Rb therefore has a thickness t in flat portions, but letting $\theta$ represent the angle between the top face of the resin substrate layer 10 and the end face of the inorganic insulating laminate film La, has a local thickness as low as $t/\cos\theta$ on the sides of the openings A as shown in FIG. 12. Accordingly, to remedy this local thickness irregularity of the second resist pattern Rb, the formation of the second resist pattern Rb may involve excessive exposure to light. The excessive exposure to light however will result in, for example, excessively narrow source lines 39*a* that are formed simultaneously, so that $t/\cos\theta$ is not greater than 1.5 times t. That forms an angle $\theta$ of less than or equal to 50° between the top face of the resin substrate layer 10 and the end face of the inorganic insulating laminate film La. If the angle $\theta$ between the top face of the resin substrate layer 10 and the end face of the inorganic insulating laminate film La is smaller than 10°, the end face of the inorganic insulating laminate film La may be located in the bending portion B, so that the inorganic insulating laminate film La could develop cracks when the frame area F is bent in the bending portion B. If the second resist pattern is thicker than the thickness of the inorganic insulating laminate film La (sum thickness of the inorganic insulating films), the second resist pattern is formed with a uniform thickness by following the shape of the openings A in the inorganic insulating laminate film La. Therefore, there is no need to control the angle between the top face of the resin substrate layer 10 and the end face of the inorganic insulating laminate film La for each part.

OLED Forming Step

First, the first electrodes 14, the edge cover 15, the organic light-emitting layers 16 (the hole injection layer 1, the hole transport layer 2, the light-emitting layer 3, the electron transport layer 4, and the electron injection layer 5), and the second electrodes 17 are formed by a well-known method on the TFT layer 20 formed in the TFT layer forming step described above.

Subsequently, an inorganic insulating film such as a silicon nitride film is formed, for example, by plasma CVD (chemical vapor deposition) so as to cover the second electrodes 17. An organic film is then formed on the inorganic insulating film by inkjet technology. An inorganic insulating film such as a silicon nitride film is formed on the organic film by plasma CVD. The sealing film 18 is thus formed, which completes the formation of the OLEDs 30.

Flexibilization Step

After the front-side protection layer 40*a* is attached to the surface of the sealing film 18 for the OLEDs 30 formed in the OLED forming step described above, a laser beam is projected onto the glass substrate side of the resin substrate layer 10, to detach the glass substrate from the bottom face of the resin substrate layer 10. The backside protection layer 40*b* is then attached to the bottom face of the resin substrate layer 10 from which the glass substrate has been detached.

The OLED display device 50 in accordance with the present embodiment can be manufactured by these steps.

As described above, according to the OLED display device 50 and the method of manufacturing the OLED display device 50 in accordance with the present embodiment, in the openings A formed in the inorganic insulating laminate film La in the etching step, the angle θa between the top face of the resin substrate layer 10 and the end face of the inorganic insulating laminate film La below between the frame wires 39c is smaller than the angle θb between the top face of the resin substrate layer 10 and the end face of the inorganic insulating laminate film La below the frame wires 39c. This structure makes it less likely for the second resist pattern Rb used in forming the frame wires 39c in the wire forming step to remain between regions where the frame wires 39c are to be formed, which in turn can make it less likely for the conductive metal laminate film 39 to remain between the frame wires 39c formed in the wire forming step. This structure can hence restrain short-circuiting between the frame wires 39c in the bending portion B of the frame area F.

Additionally, according to the OLED display device 50 and the method of manufacturing the OLED display device 50 in accordance with the present embodiment, the inorganic insulating laminate film La has, below between the frame wires 39c, the projection portions P formed in the opening A so as to taper toward the widthwise center of the opening A. This structure can thus restrain short-circuiting between the frame wires 39c in the bending portion B of the frame area F and still make it easier to bend the frame area F in the bending portion B.

In addition, according to the OLED display device 50 and the method of manufacturing the OLED display device 50 in accordance with the present embodiment, the top face of the resin substrate layer and the end face of the projection portion P forms an angle of less than or equal to 50°. This structure can make the thickness of the second resist pattern Rb 1.5 times or less as large on the sides of the opening A formed in the inorganic insulating laminate film La as in the flat portions.

Additionally, according to the OLED display device 50 and the method of manufacturing the OLED display device 50 in accordance with the present embodiment, the bending portion B of the frame area F includes the planarization film 13b covering the frame wires 39c. This structure can reduce damage to the frame wires 39c.

OTHER EMBODIMENTS

The embodiments have so far discussed examples where the organic light-emitting layer includes a stack of five layers: a hole injection layer, a hole transport layer, a light-emitting layer, an electron transport layer, and an electron injection layer. Alternatively, the organic light-emitting layer may include, for example, a stack of three layers: a hole injection and transport layer, a light-emitting layer, and an electron transport and injection layer.

The embodiments have so far discussed examples where the OLED display device includes the first electrodes serving as anodes and the second electrodes serving as cathodes. The disclosure is applicable also to an OLED display device in which the layer structure of the organic light-emitting layer is reversed so that the first electrodes serve as cathodes and the second electrodes serve as anodes.

The embodiments have so far discussed examples where the OLED display device includes an element substrate where the electrode of the TFT connected to the first electrode serves as the drain electrode. The disclosure is applicable also to an OLED display device including an element substrate where the electrode of the TFT connected to the first electrode serves as the source electrode.

The embodiments have so far discussed the OLED display device as an exemplary display device. The disclosure is applicable to any display device including a plurality of current-driven light-emitting elements, for instance, to a display device including QLEDs (quantum-dot light emitting diodes) which are light-emitting elements including a quantum dot layer.

INDUSTRIAL APPLICABILITY

As described above, the disclosure is useful in flexible display devices.

The invention claimed is:

1. A display device comprising:
a resin substrate; a TFT layer on the resin substrate;
light-emitting elements on the TFT layer, the light-emitting elements forming a display area;
a frame area surrounding the display area;
a terminal region along a side of the frame area; a bending portion between the display area and the terminal region, the bending portion being extended in one direction; at least one inorganic insulating film on the resin substrate, the at least one inorganic insulating film forming the TFT layer; and a plurality of wires in the frame area, the plurality of wires forming the TFT layer and running parallel to each other in a direction crossing the direction in which the bending portion is extended, wherein
the at least one inorganic insulating film has an opening therethrough in the bending portion, a top face of the resin substrate being exposed in the opening,
the plurality of wires is provided on the at least one inorganic insulating film and on the top face of the resin substrate exposed in the opening, and in the opening, the top face of the resin substrate and an end face of the at least one inorganic insulating film make a smaller angle below between the plurality of wires than below the plurality of wires.

2. The display device according to claim 1, wherein the opening has a first width in the direction crossing the direction in which the bending portion is extended below between the plurality of wires and a second width in the direction crossing the direction in which the bending portion is extended below the plurality of wires, the first width being smaller than the second width.

3. The display device according to claim 2, wherein the at least one inorganic insulating film includes a projection portion in the opening below between the plurality of wires, the projection portion being formed so as to taper toward a widthwise center of the opening.

4. The display device according to claim 3, wherein the top face of the resin substrate and an end face of the projection portion make an angle of from 10° to 50°, both inclusive.

5. The display device according to claim 3, wherein the at least one inorganic insulating film includes the projection portion on two sides of the opening with respect to the direction crossing the direction in which the bending portion is extended.

6. The display device according to claim 1, wherein the bending portion includes a planarization film covering the plurality of wires.

7. The display device according to claim 6, wherein the resin substrate and the planarization film are made of polyimide resin.

8. The display device according to claim 1, wherein the opening is shaped like a groove running through in the direction in which the bending portion is extended.

9. The display device according to claim 1, wherein the light-emitting elements are organic light-emitting diodes.

10. A method of manufacturing a display device including: a resin substrate; a TFT layer on the resin substrate; light-emitting elements on the TFT layer, the light-emitting elements forming a display area; a frame area surrounding the display area; a terminal region along a side of the frame area; a bending portion between the display area and the terminal region, the bending portion being extended in one direction; at least one inorganic insulating film on the resin substrate, the at least one inorganic insulating film forming the TFT layer; and a plurality of wires in the frame area, the plurality of wires forming the TFT layer and running parallel to each other in a direction crossing the direction in which the bending portion is extended, the method comprising:

the etching step of forming an opening through the at least one inorganic insulating film in the bending portion, the resin substrate being exposed in the opening; and the wire forming step of forming the plurality of wires on a top face of the resin substrate exposed in the opening formed in the etching step and on an end surface of the at least one inorganic insulating film having the opening therethrough, wherein the etching step removes the at least one inorganic insulating film exposed under a resist pattern formed using a halftone mask so as to form the opening such that the top face of the resin substrate and an end face of the at least one inorganic insulating film make a smaller angle below between the plurality of wires than below the plurality of wires, and the wire forming step removes a conductive film exposed under a resist pattern formed thinner than a sum thickness of the at least one inorganic insulating film, to form the plurality of wires.

11. The method according to claim 10, wherein the light-emitting elements are organic light-emitting diodes.

* * * * *